(12) United States Patent
Hickman (10) Patent No.: US 8,029,947 B2
(45) Date of Patent: Oct. 4, 2011

(54) SYSTEMS AND METHODS FOR IMPLEMENTING AND MANUFACTURING RETICLES FOR USE IN PHOTOLITHOGRAPHY TOOLS

(75) Inventor: Craig A. Hickman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 802 days.

(21) Appl. No.: 11/217,888

(22) Filed: Sep. 1, 2005

(65) Prior Publication Data

US 2007/0048627 A1 Mar. 1, 2007

(51) Int. Cl.
*G03F 1/00* (2006.01)
*G03F 9/00* (2006.01)
*G03C 5/00* (2006.01)

(52) U.S. Cl. .................. 430/5; 430/30; 430/22
(58) Field of Classification Search ............... 430/5, 22, 430/30; 355/52, 55, 56; 716/19, 20, 21
See application file for complete search history.

(56) References Cited

U.S. PATENT DOCUMENTS

| | | | |
|---|---|---|---|
| 4,719,705 A | 1/1988 | Laganza et al. | |
| 5,586,058 A | 12/1996 | Aloni et al. | |
| 5,868,560 A * | 2/1999 | Tamada et al. | 430/5 |
| 6,071,656 A * | 6/2000 | Lin | 430/22 |
| 6,360,005 B1 | 3/2002 | Aloni et al. | |
| 6,532,056 B2 | 3/2003 | Osakabe et al. | |
| 6,635,872 B2 | 10/2003 | Davidson | |
| 6,704,091 B2 * | 3/2004 | Moriyama | 355/53 |
| 6,727,565 B2 * | 4/2004 | Itoh | 257/435 |
| 6,734,950 B2 | 5/2004 | Nakano | |
| 6,765,673 B1 * | 7/2004 | Higashikawa | 356/399 |
| 2003/0076989 A1 | 4/2003 | Maayah et al. | |
| 2004/0057030 A1 | 3/2004 | Okubo et al. | |
| 2004/0165164 A1 * | 8/2004 | Raebiger et al. | 355/53 |

* cited by examiner

*Primary Examiner* — Mark F Huff
*Assistant Examiner* — Jonathan Jelsma
(74) *Attorney, Agent, or Firm* — Perkins Coie LLP (57) ABSTRACT

Methods, systems, and tool sets involving reticles and photolithography processing. Several embodiments of the invention are directed toward obtaining qualitative data from within the pattern area of a reticle that is indicative of the physical characteristics of the pattern area. Additional embodiments of the invention are directed toward obtaining qualitative data indicative of the physical characteristics of the reticle remotely from a photolithography tool. These two aspects of the invention can be combined in further embodiments in which qualitative data is obtained from within the pattern area of a reticle in a tool that is located remotely from the photolithography tool. As a result, several embodiments of methods and systems in accordance with the invention provide data taken from within the pattern area to more accurately reflect the contour of the pattern area of the reticle without using the photolithography tool to obtain such measurements. This is expected to provide more accurate data for correcting the photolithography tool to compensate for variances in the pattern area, and it is expected to increase throughput because the photolithography tool is not taken away from processing production wafers to measure the reticle.

33 Claims, 6 Drawing Sheets

SYSTEMS AND METHODS FOR IMPLEMENTING AND MANUFACTURING RETICLES FOR USE IN PHOTOLITHOGRAPHY TOOLS

TECHNICAL FIELD

The present invention is directed to methods and apparatus for manufacturing and implementing reticles for use with scanners, steppers, and other photolithography tools. Many embodiments of the invention are directed to reticles used in the manufacturing of semiconductor devices, microlenses, micro-mechanical devices, micro-electronic devices, and other types of micro-feature devices.

BACKGROUND

Micro-feature devices have a large number of very small features that are typically formed in and/or on wafers or other types of workpieces by selectively removing material from the wafer and/or depositing material onto the wafer. For example, features are often formed by (a) constructing a pattern in a layer of resist to form a mask on the wafer, (b) etching holes and/or trenches in the wafer through openings in the mask, and (c) filling the resulting features with dielectric, semiconductive, and/or conductive materials. Photolithographic processes are generally used to transfer the intricate patterns of the features onto discrete areas of the layer of resist.

A typical photolithographic process includes depositing a layer of radiation-sensitive photoresist material on the wafer, positioning a reticle having a mask pattern over a selected area of the photoresist, and then passing an imaging radiation through the reticle to expose the photoresist in the configuration of the mask pattern. A developer, such as an aqueous base or a solvent, is used to remove either the irradiated areas or the masked areas of the photoresist. For example, when the radiation changes the photoresist from being generally soluble in the developer to generally insoluble, then the developer removes the masked portions of the resist layer. Alternatively, when the radiation changes a photoresist from being generally insoluble in the developer to be generally soluble, then the developer removes the exposed portions of the photoresist.

Existing lithography processes are capable of creating very complex patterns of extremely small features across the surface of a wafer to form the trenches, vias, holes, implant regions, conductive lines, gates, and other features on a wafer. In a typical application, a lithographic tool transfers the pattern in the reticle to the workpiece by scanning or stepping the pattern across precise areas of the workpiece. As microelectronic devices become more complex, there is a drive to continually decrease the size of the individual features and increase the density of the features across the wafer. This significantly increases the complexity of lithographic processing because it is increasingly difficult to accurately focus the pattern onto the face of the wafer. In many applications, the depth of field for focusing the pattern on the wafer is so small that slight variations in the wafer surface and/or the reticle can adversely affect the quality of the pattern transferred to the wafer.

One conventional process to compensate for non-uniformities in reticles is to measure the flatness of the reticles in the photolithography tool before processing the wafers. The topography of the reticles is conventionally measured by detecting light that passes through alignment marks in a perimeter region outside of the pattern area of the reticle. Based on the topographical data of the alignment marks in the perimeter region around the pattern area of the reticle, the topography of the pattern area is estimated. Conventional lithographic tools are then adjusted by tilting the wafer stage and/or adjusting the optics to compensate for variances in the estimated pattern area of the reticle (e.g., the estimated curvature of the reticle).

One problem with such conventional processes is that the topography in the pattern area of the reticle is estimated based on the alignment marks in the perimeter region of the reticle. As the feature sizes decrease, this may not provide sufficiently accurate data to compensate for non-uniformities in the pattern area. Moreover, lithographic tools are extremely expensive and it is very costly to use lithographic tools for measuring the non-uniformities in the reticle. Such use of lithographic tools is expected to reduce the throughput of processing wafers because the time period for qualifying the reticles is effectively downtime for processing wafers. Therefore, there exists a need to improve conventional photolithographic processes.

DETAILED DESCRIPTION

A. Overview

The present invention is directed toward methods, systems and tool sets for manufacturing and/or implementing reticles in photolithography processing. Several embodiments of the invention are directed toward obtaining qualitative data indicative of the physical characteristics of a reticle from within the pattern area and/or a perimeter region. Additional embodiments of the invention are directed toward obtaining qualitative data indicative of the physical characteristics of the reticle remotely from a photolithography tool. These two aspects of the invention can be combined in further embodiments in which qualitative data is obtained from within the pattern area of a reticle using a measurement tool located remotely from the photolithography tool. As a result, several embodiments of methods and systems in accordance with the invention provide data taken from within the pattern area to more accurately reflect the features of the pattern area of the reticle without using a photolithography tool to obtain such measurements. This is expected to provide more accurate data for adjusting photolithography tools to compensate for variances in the pattern area, and it is expected to enhance the productivity of such photolithography tools because they can process production wafers instead of calibrating the reticle.

Several embodiments of the invention are directed toward methods for manufacturing a reticle for use in a photolithography tool. One particular embodiment of such a method comprises providing a substrate having a pattern area and a perimeter region outside of the pattern area. This method continues by obtaining qualitative data indicative of physical characteristics of the substrate from points or regions within the pattern area and/or the perimeter region. The qualitative data, for example, can be a measurement of the contour or non-uniformities of the reticle from several points within the pattern area. The qualitative data is preferably obtained remotely from the photolithography tool either before or after forming a pattern in the pattern area of the reticle. After the qualitative data has been obtained, the method continues by determining a correction model based at least in part on the qualitative data to apply to the photolithography tool. The correction model, for example, can be used to adjust the position of the wafer stage and/or adjust the optics of the photolithography tool to compensate for the unique physical characteristics of the particular reticle.

Several other embodiments of the invention are directed toward implementing a reticle in a photolithography tool. One particular embodiment of such a method includes obtaining topographical data from within the pattern area of the reticle. The pattern area, for example, is the portion of the reticle through which an exposure radiation is to be directed for transferring a pattern from the reticle to a wafer. The topographical data is preferably obtained remotely from the photolithography tool either before or after forming a pattern in the pattern area of the reticle. This method continues by determining a correction model and applying the correction model to the photolithography tool to adjust for the topography or other unique physical characteristics in the pattern area of the reticle. The correction model is determined at least in part from the topographical data obtained from within the pattern area.

Another embodiment of a method for implementing a reticle in a photolithography tool comprises obtaining qualitative data from within a pattern area of the reticle. This method continues by determining a correction model to apply to the photolithography tool from the qualitative data, and applying the correction model to the photolithography tool to adjust for the topography or other unique physical characteristics in the pattern area of the reticle.

Yet another method of implementing a reticle in a photolithography tool in accordance with the invention comprises obtaining qualitative data from the reticle at a location remote from the photolithography tool, and determining a correction model to apply to the photolithography tool from the qualitative data. The correction model may be calculated using a computer located either (a) remotely from the lithography tool or (b) with the lithography tool. This method continues by applying the correction model to the photolithography tool to adjust for topography or other unique physical characteristics in the pattern area of the reticle.

Additional embodiments of the invention are directed to methods for processing micro-device wafers. One embodiment of such a method comprises obtaining qualitative data from within a pattern area of a reticle. This method continues by determining a correction model to apply to the photolithography tool from the qualitative data, and adjusting the photolithography tool to compensate for features of the reticle based on the correction model. This method further continues by exposing the wafer to an exposure radiation to transfer a pattern in the pattern area of the reticle to a wafer in the photolithography tool.

Additional embodiments of the invention are directed toward a system for implementing a reticle in a photolithography tool. One embodiment of such a system comprises a measuring station located remotely from the photolithography tool and a correction module. The measuring station is configured to obtain qualitative data from within a pattern area of a reticle. The correction module includes a computer operable medium containing instructions that use the qualitative data to determine a correction model for adjusting the photolithography tool to compensate for features of the reticle in the pattern area.

Various embodiments of the invention are described in this section to provide specific details for a thorough understanding and enabling description of these embodiments. A person skilled in the art, however, will understand that the invention may be practiced without several of these details, or that additional details can be added to the invention. Well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or types of other features or other components are not precluded.

Figure 1:
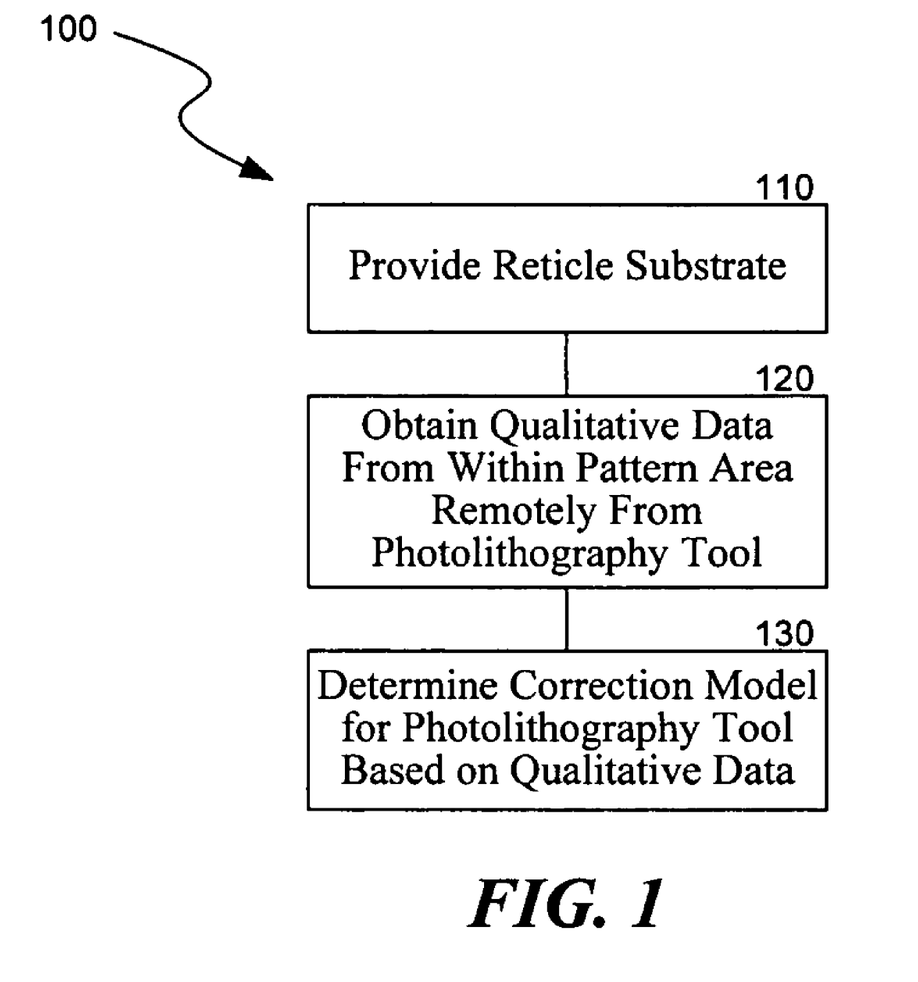
FIG. 1 is a flow chart of a method for manufacturing a reticle in accordance with an embodiment of the invention.

B. Embodiments of Methods for Manufacturing Reticles for Use in Photolithography Tools FIG. 1 is a flow chart illustrating a method 100 for manufacturing a reticle for use in a photolithography tool in accordance with an embodiment of the invention. The illustrated embodiment of the method 100 includes a first stage 110 comprising providing a substrate having a pattern area and a perimeter region outside of the pattern area. The substrate is typically a piece of glass or other article having the desired optical properties for transmitting the imaging radiation used in the photolithography tool. At this stage of the method, the substrate can have a pattern already formed in the pattern area, or the substrate can be provided without having a pattern formed in the pattern area. In general, the pattern area is the region of the substrate wherein a pattern is or will be formed. The pattern area is accordingly located so that an exposure can transfer a pattern formed in the pattern area to a wafer when the reticle is used in a photolithography tool.

The method 100 continues with a second stage 120 comprising obtaining qualitative data indicative of at least one physical characteristic of the substrate from points or areas within the pattern area and/or the perimeter region. In the illustrated embodiment of the method 100, the qualitative data is obtained remotely from the photolithography tool. For example, a metrology tool or other type of measuring tool can be located at a measuring station separate from the photolithography tool. Suitable remote locations for obtaining the qualitative data include mask vendors or mask shops where the substrate is qualified before forming a pattern and/or where a pattern is formed in the pattern area. The remote locations for obtaining the qualitative data, however, can include any other location where the particular physical characteristic of the substrate can be measured without interrupting the processing of wafers in the photolithography tool.

Figure 2A:
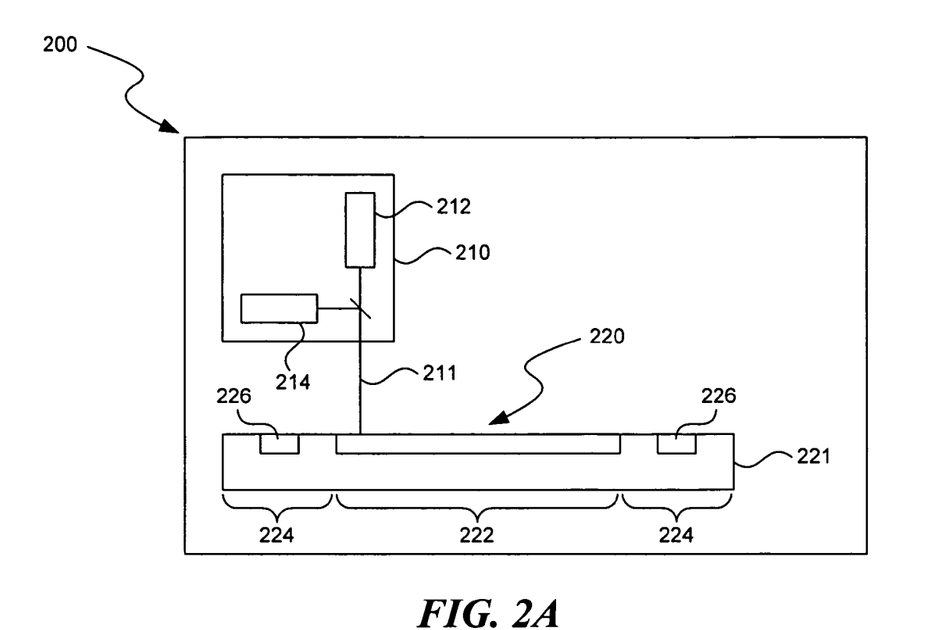
FIG. 2A is a schematic view of a procedure for obtaining qualitative data from within a pattern area of a reticle at a location remote from a photolithography tool in accordance with an embodiment of the invention.
Figure 2B:
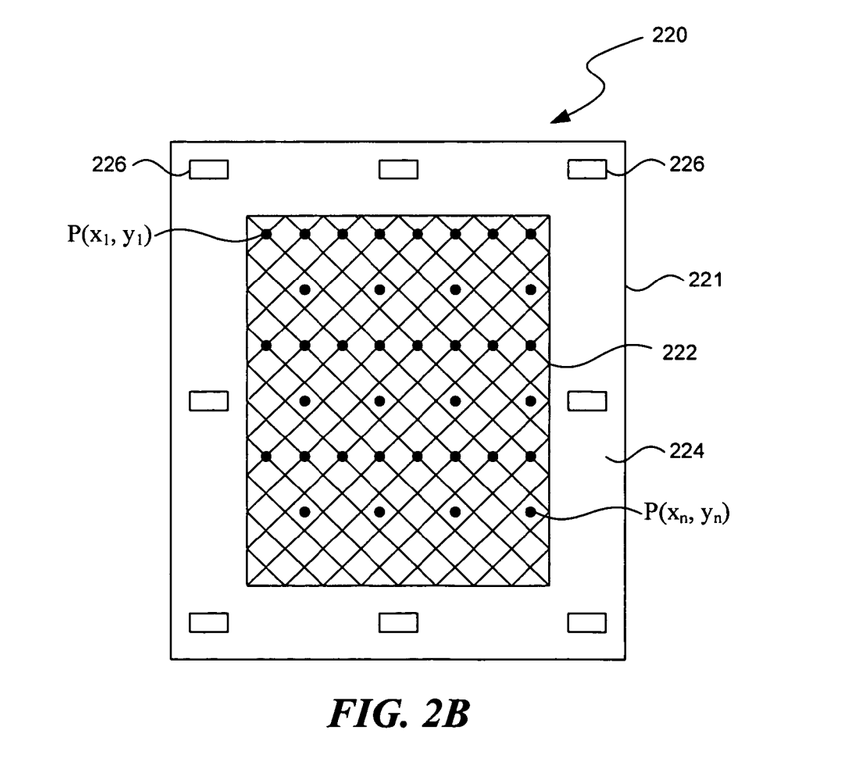
FIG. 2B is a schematic view of a reticle being processed in accordance with several embodiments of the invention.

FIG. 2A is a schematic view of the second stage 120 of the method 100, and FIG. 2B is a schematic top plan view of a reticle 220 being processed in the second stage 120. Referring to FIG. 2A, the second stage 120 can occur at a measuring tool 200 having a non-contact measuring unit 210 including an illumination source 212 and a detector 214. The measuring unit 210 can be an interferometer, scatterometer, ultrasonic probe, topology tool, or any other type of device that can determine a physical characteristic indicative of the contour, curvature, or other feature of the reticle 220. Referring to FIGS. 2A and 2B together, the second stage 120 includes placing the reticle 220 in the measuring tool 200. The reticle 220 can have a substrate 221 including a pattern area 222 and a perimeter region 224. The illumination source 212 generates a non-contact measuring energy 211 (e.g., a laser beam), and the detector 214 detects a return signal of the non-contact energy 211. The tool 200 operates the measuring unit 210 and/or moves the reticle 220 such that the beam 211 measures a physical characteristic at a plurality of points in the pattern area 222 of the reticle 220 and/or the perimeter region 224.

Referring to FIG. 2B, for example, the second stage 120 can include measuring the elevation of the surface or other aspects of the surface topology of the substrate 221 at points $P(x_1, y_1)$ through $P(x_n, y_n)$ throughout a large number of points in the pattern area 222. Each measurement point P is actually a spot having a small area. The second stage 120 can further include measuring the surface elevation or topology at alignment marks 226, other types of fiducials, or the perimeter region 224. The number of measurement points P in the pattern area 222 and/or the perimeter region 224 can be as low as a few points to as high as several thousand points. In several applications, the number of measurement points P in the pattern area 222 can be from approximately 10 to approximately 5,000, and more preferably from approximately 50 to approximately 5,000, and still more preferably from approximately 250 to about 2,500. The number of measurement points P is typically a function of the desired resolution and the time available for obtaining the qualitative data. A large number of measurement points P will result in a more accurate assessment of the contour and shape of the reticle 220 within the pattern area 222, but a lower number of measurement points P reduces the measurement time and data processing time. In practical applications, a large number of measurement points P may be used because the qualitative data is obtained remotely from the photolithography tool such that the measurement time is not an issue in stage 120 as it is when the photolithography tool is used to measure the reticles in conventional processes.

Referring again to FIG. 1, the method 100 further includes a third stage 130 comprising determining a correction model based at least in part on the qualitative data. The correction model can be calculated or otherwise ascertained remotely from the photolithography tool, or the correction model can be ascertained in a module or other component of the photolithography tool. The correction model determined in the third stage 130 preferably sets forth the adjustments for the imaging optics and/or the wafer stage of the photolithography tool to compensate for the curvature or other features in the pattern area 222 of the reticle 220.

One aspect of the method 100 is that the inventors have discovered that the curvature and other selected features of a reticle substrate typically do not change throughout the process of manufacturing the reticle. As a result, the flatness or other physical characteristics of the reticle substrate can be measured remotely from the fabrication line before or after a pattern is formed on the reticle, and before loading the reticle into a particular photolithography. The particular photolithography tool, therefore, does not need to be taken off-line to measure the contour of the reticle in the perimeter region. The method 100 is accordingly expected to enhance the efficiency of manufacturing semiconductor devices and other types of micro-devices.

Another aspect of several embodiments of the method 100 is that the correction model determined in the third stage 130 is expected to provide better data to compensate for the unique features of a particular reticle. Unlike the conventional processes that measure points only in the perimeter region of a reticle, several embodiments of the method 100 obtain the qualitative data from within the pattern area 222 of the reticle 220. As a result, the qualitative data used to determine the correction model in the third stage 130 includes actual measurements of the pattern area 222 instead of an estimated contour of the pattern area based on measurements taken in the peripheral area. Several embodiments of the method 100 can further enhance the accuracy of the qualitative data by obtaining a large number of measurement points in the pattern area. Therefore, the method 100 is expected to result in a highly accurate assessment of the physical characteristics of the pattern area 222 for calculating a highly accurate correction model.

C. Methods and Systems for Implementing a Reticle in a Photolithography Tool

Figure 3:
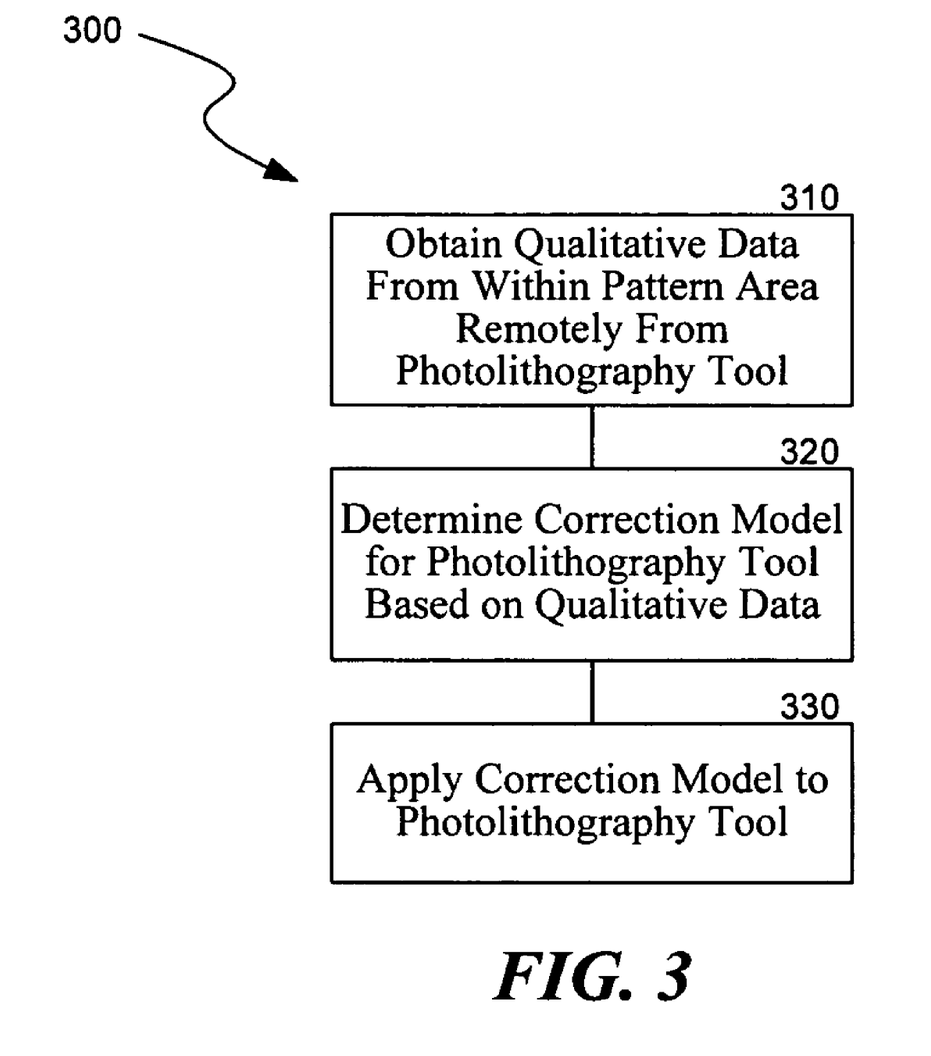
FIG. 3 is a flow chart of a method for implementing a reticle in a photolithography tool in accordance with an embodiment of the invention.

FIG. 3 is a flow chart illustrating a method 300 in accordance with an embodiment for implementing a reticle in a photolithography tool in accordance with the invention. The method 300 includes a first stage 310 comprising obtaining qualitative data from within a pattern area remotely from the photolithography tool, and a second stage 320 comprising determining a correction model for the photolithography tool based on the qualitative data obtained in the first stage 310. The first and second stages 310 and 320 shown in FIG. 3 can be similar to the second and third stages 120 and 130, respectively, shown in FIG. 1. The method 300 further includes a third stage 330 comprising applying the correction model to the photolithography tool. Several aspects of applying the correction model to the photolithography tool are best set forth with reference to the environments in which a reticle is measured and implemented.

Figure 4:
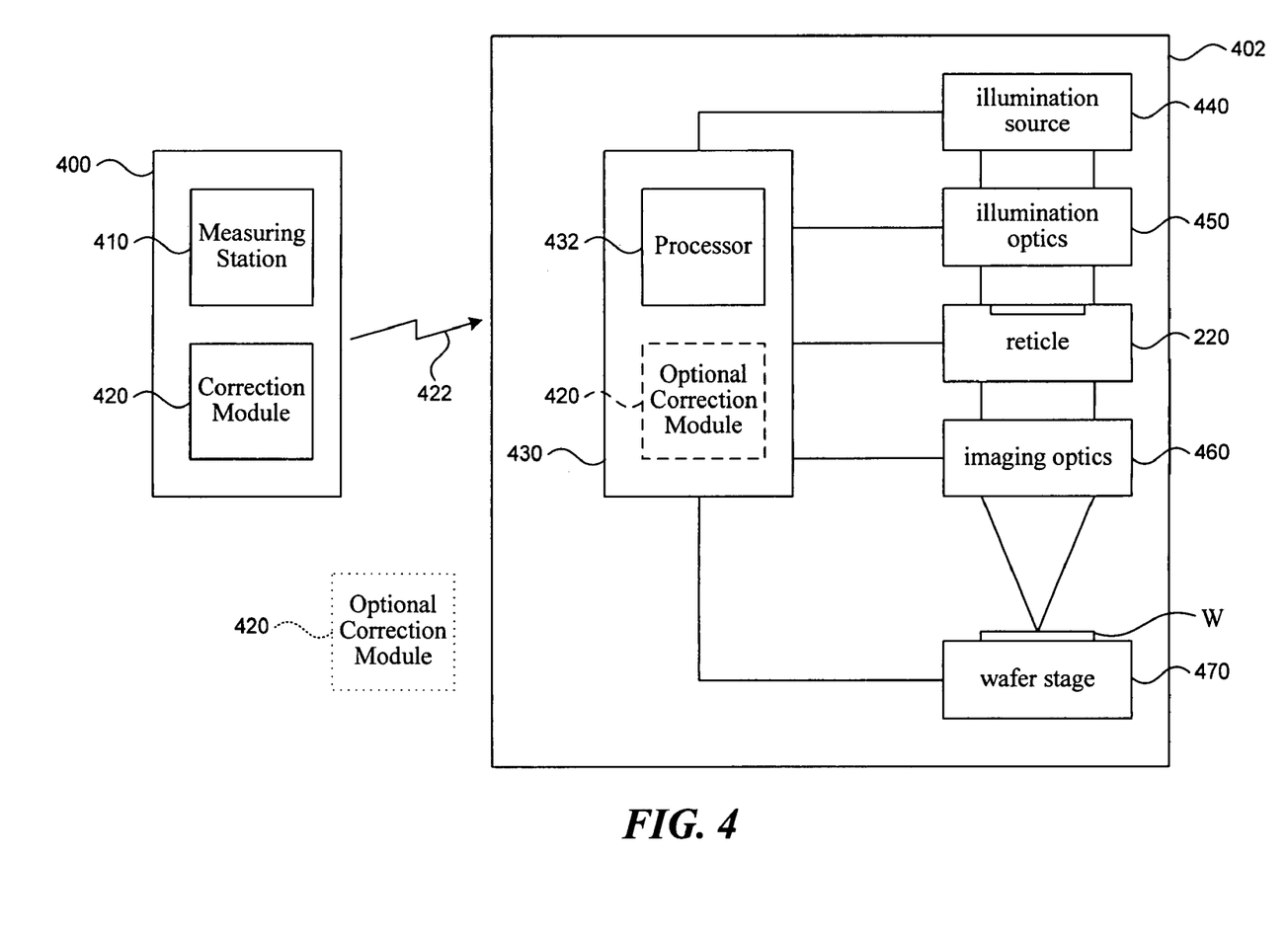
FIG. 4 is a schematic illustration of a system for implementing a reticle in a photolithography tool in accordance with several embodiments of the invention.

FIG. 4 is a schematic illustration of one embodiment of a system 400 for implementing a reticle in a photolithography tool 402. The system 400 can include a measuring station 410 located remotely from the photolithography tool 402. As described above, the measuring station obtains the qualitative data from within a pattern area and/or a perimeter region of a reticle to ascertain a physical characteristic of the pattern area. The system 400 further includes a correction module 420 having a computer operable medium that contains instructions which use the qualitative data to determine a correction model for adjusting the photolithography tool to compensate for the measured physical characteristic of the reticle. The correction module 420 can be hardware and/or software that is located with the measuring station 410 as shown in solid lines in FIG. 4. In an alternative embodiment, the correction module 420 is optionally separate from both the measuring station 410 and the photolithography tool 402 (as shown in dotted lines), or the correction module 420 is optionally a component associated with the photolithography tool 402 (shown in dashed lines).

In operation, the correction module 420 determines a correction model that is transmitted to the photolithography tool 402 by a communication link 422 (e.g., a wired or wireless link). The photolithography tool 402 uses the correction model to adjust components of the photolithography tool 402 to compensate for the unique features of the pattern area of the reticle. For example, the photolithography tool 402 can include a controller 430 having a processor 432 that incorporates the correction model from the correction module 420 into the operation of the photolithography tool 402. The controller 432, for example, can adjust any one of the following items either individually or in various combinations with each other to compensate for the measured features of the reticle 220: an illumination source 440; illumination optics 450; imaging optics 460; and/or a wafer stage 470 upon which a wafer W is positioned.

Several embodiments of the third stage 330 of the method 300 illustrated in FIG. 3 apply the correction model to the photolithography tool by registering or otherwise associating the measurement points P (FIG. 2B) on the reticle 220 with the reference system of the photolithography tool 402 (FIG. 4). For example, one embodiment of the third stage further comprises registering a measurement reference frame in which the qualitative data was obtained in the measurement station 410 with a process reference frame of the photolithography tool 402 in which a pattern is transferred to the wafer W. The measurement reference frame can be registered with the process reference frame by registering fiducial marks on the reticle 220 in both the measurement and process reference frames, and then determining an offset to apply to the measurement points P for calculating the coordinates of the measurement points P in the process reference frame. Based on the registered coordinates of the measurement points P in the process reference frame of the photolithography tool 402, the controller 430 can operate the device to adjust the optics and/or the wafer stage 470 according to the correction model determined in the correction module 420.

Figure 5:
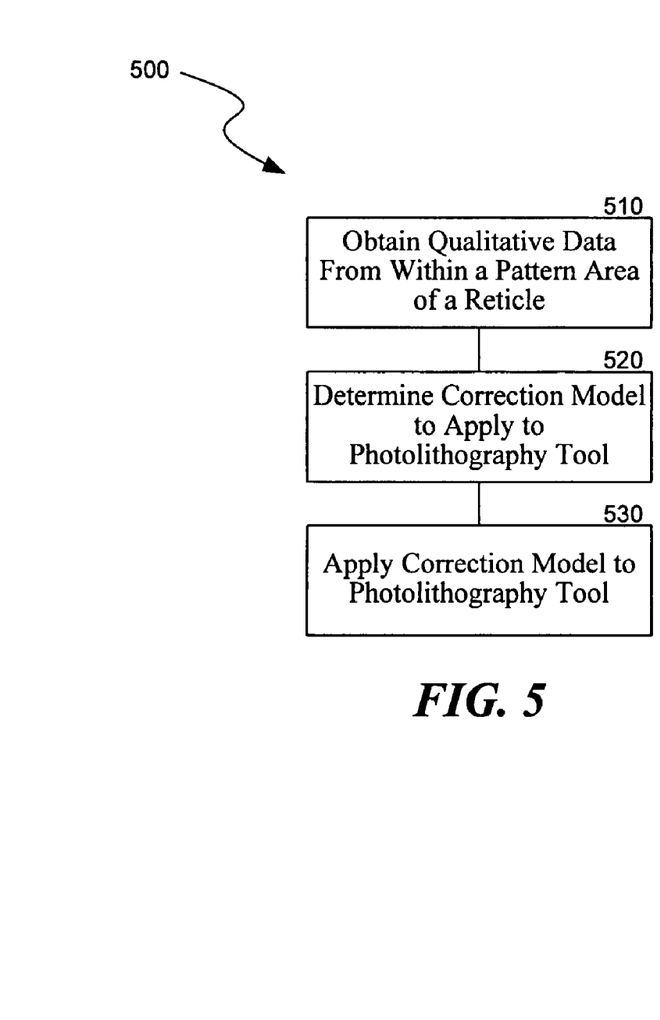
FIG. 5 is a flow chart of a method for implementing a reticle in a photolithography tool in accordance with another embodiment of the invention.

FIG. 5 is a flow chart illustrating a method 500 for implementing a reticle in a photolithography tool in accordance with another embodiment of the invention. The method 500 includes a first stage 510 comprising obtaining qualitative data from within a pattern area of the reticle through which an exposure radiation is to be directed for transferring a pattern from the reticle to a wafer. The method 500 further includes a second stage 520 comprising determining a correction model to apply to the photolithography tool based on the qualitative data, and a third stage 530 comprising applying the correction model to the photolithography tool to adjust for unique physical characteristics in the pattern area of a reticle. The method 500 shown in FIG. 5 can be similar to the method 300 illustrated in FIG. 3, but the qualitative data is not necessarily obtained remotely from the photolithography tool. Otherwise, the second stage 520 and the third stage 530 can be similar to the second and third stages 320 and 330, respectively, discussed above with reference to FIGS. 3 and 4.

Figure 6:
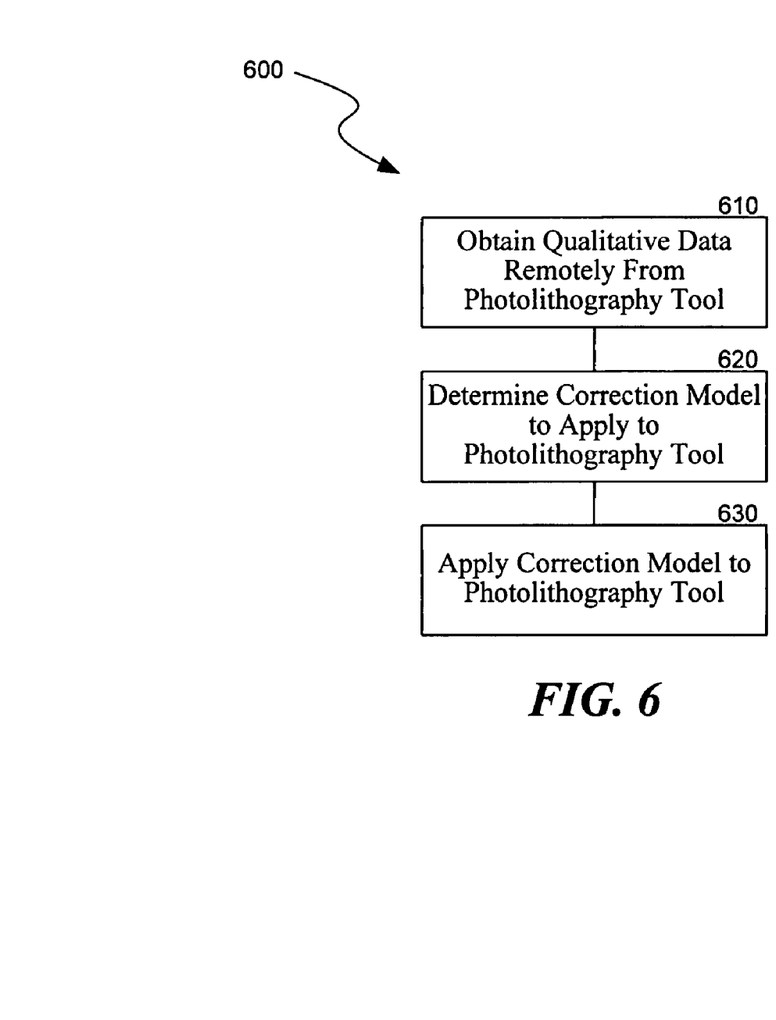
FIG. 6 is a flow chart of a method for implementing a reticle in a photolithography tool in accordance with still another embodiment of the invention.

FIG. 6 is a flow chart of a method 600 for implementing a reticle in a photolithography tool in accordance with still another embodiment of the invention. The method 600 illustrated in FIG. 6 includes a first stage 610 comprising obtaining qualitative data from the reticle at a location remote from the photolithography tool. The qualitative data obtained in the first stage 610 is not necessarily limited to data from within the pattern area of a reticle, but can include (a) data from only a perimeter region of the reticle, (b) data from within only a pattern area of a reticle, or (c) data from within both a perimeter region and the pattern area of a reticle. The method 600 further includes a second stage comprising determining a correction model to apply to the photolithography tool, and a third stage 630 comprising applying the correction model to the photolithography tool.

Figure 7:
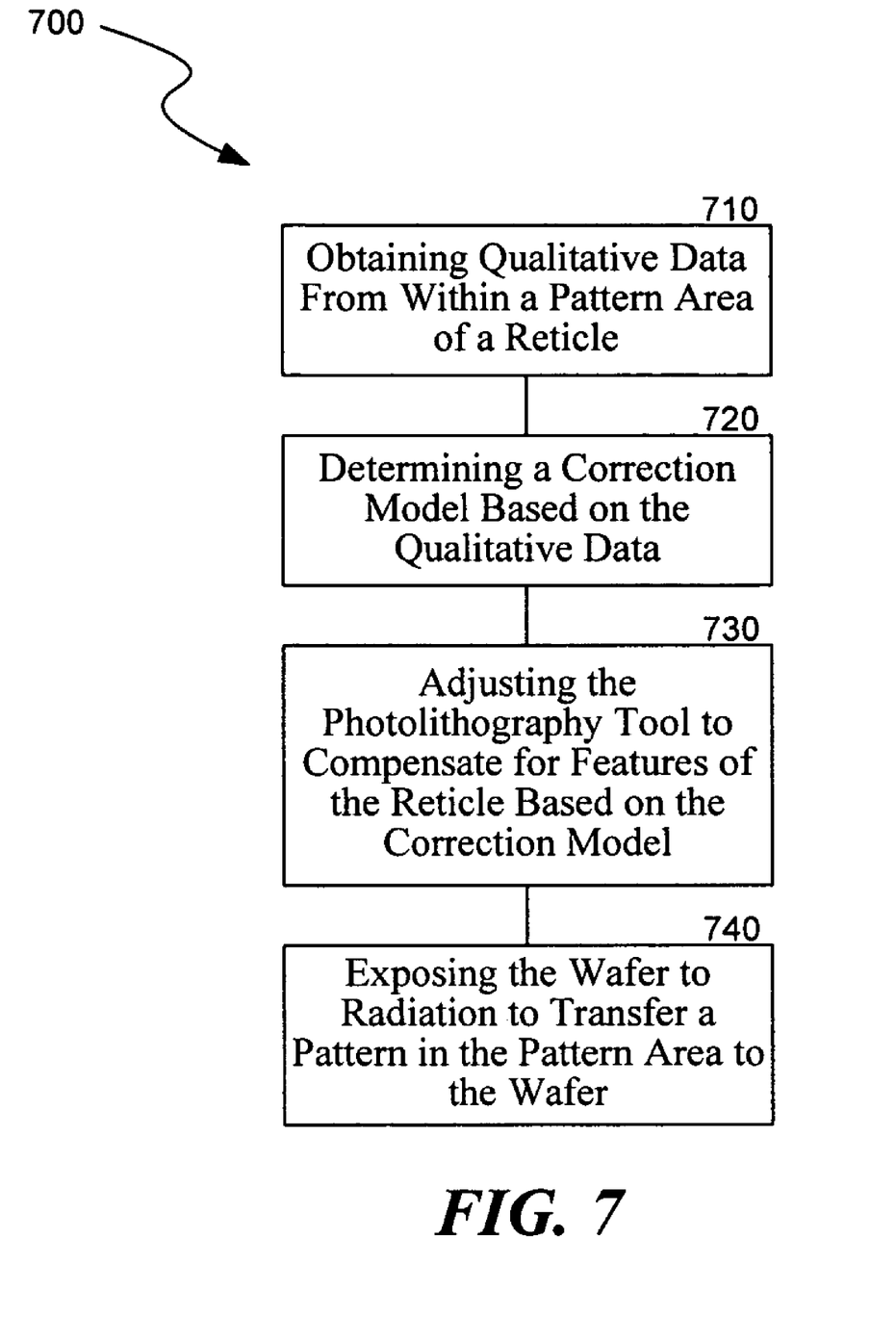
FIG. 7 is a flow chart of a method for processing a micro-device wafer in accordance with an embodiment of the invention.

FIG. 7 is a flow chart illustrating a method 700 for processing a micro-device wafer in accordance with an embodiment of the invention. The method 700 includes a first stage 710 comprising obtaining qualitative data from within a pattern area of a reticle. In general, the first stage 710 includes obtaining data regarding the contour or other physical characteristics of the pattern area where an exposure radiation from the photolithography tool passes toward the workpiece. The method 700 further includes a second stage 720 comprising determining a correction model based on the qualitative data to apply to the photolithography tool, and a third stage 730 comprising adjusting the photolithography tool to compensate for features of the reticle. The third stage 730 adjusts the photolithography tool based on the correction model determined in the second stage 720. The method 700 further includes a fourth stage 740 comprising exposing the wafer to an exposure radiation to transfer a pattern in the pattern area of a reticle to a wafer in the photolithography tool. The fourth stage 740 can include stepping and/or scanning the pattern across the wafer by moving the wafer stage and adjusting the optics according to processes known in the semiconductor fabrication industry.

From the foregoing, it will be appreciated that specific embodiments of the invention have been described herein for purposes of illustration, but that various modifications may be made without deviating from the spirit and scope of the invention. For example, various aspects of each of the foregoing embodiments described above can be combined with each other in additional embodiments of the invention. Accordingly, the invention is not limited except as by the appended claims.

I claim:

1. A method of manufacturing a reticle for use in a photolithography tool, comprising:
   providing a reticle substrate having a pattern area and a perimeter region outside of the pattern area, the perimeter region having a first, unpatterned area and a second area having alignment marks, wherein the first, unpatterned area is distinct from the second area, and wherein the perimeter region is bounded by the pattern area and by an edge of the reticle substrate;
   obtaining qualitative data from within (a) the pattern area and (b) the first, unpatterned area distinct from the second area of the perimeter region, the data being indicative of physical characteristics of the reticle substrate within the pattern area, wherein the qualitative data is obtained remotely from the photolithography tool; and
   determining a correction model based at least in part on the qualitative data to apply to the photolithography tool.

2. The method of claim 1, further comprising fabricating a pattern to be transferred to a wafer in the pattern area before obtaining the qualitative data.

3. The method of claim 1, further comprising fabricating a pattern to be transferred to a wafer in the pattern area after obtaining the qualitative data.

4. The method of claim 1 wherein obtaining the qualitative data comprises measuring a parameter related to surface non-uniformities of the reticle substrate at a plurality of locations in the pattern area.

5. The method of claim 4 wherein the parameter comprises a variance from a reference plane.

6. The method of claim 4 wherein the parameter is measured at greater than 60 locations in the pattern area.

7. The method of claim 4 wherein the parameter is measured at 50-5000 locations in the pattern area.

8. The method of claim 1 wherein determining a correction model comprises determining an adjustment factor to apply to at least one of an image optic of the photolithography tool and a wafer stage of the photolithography tool.

9. The method of claim 1 wherein determining a correction model comprises determining an adjustment to at least one of an image optic of the photolithography tool and a wafer stage of the photolithography tool to compensate for non-uniformities in the pattern area.

10. The method of claim 1, further comprising transferring the qualitative data from a remote measurement location where the qualitative data is obtained to a correction module that determines the correction model.

11. The method of claim 1, further comprising registering a measurement reference frame for at least the first and second areas in which the qualitative data was obtained with a process reference frame of the photolithography tool in which a pattern is transferred to a wafer.

12. The method of claim 11 wherein registering the measurement reference frame with the process reference frame comprises registering fiducial marks from the second area on the reticle substrate with the process reference frame.

13. The method of claim 12 wherein registering the fiducial marks on the substrate with the process reference frame comprises determining locations of the fiducial marks in the process reference frame and calculating coordinates in the process reference frame of measurement points in the pattern area.

14. The method of claim 11 wherein registering the measurement reference frame with the process reference frame comprises (a) providing a reference reticle having reference fiducials, (b) detecting a first set of locations of the reference fiducials in the measurement reference frame, (c) detecting a second set of locations of the reference fiducials in the process reference frame, (d) determining an offset using the first and second location sets, and (e) applying the offset to the qualitative data.

15. The method of claim 1, further comprising providing a computer operable medium to the photolithography tool, wherein the computer operable medium contains instructions that cause the photolithography tool to adjust at least one of an image optic and a wafer stage to compensate for topographical non-uniformities in the pattern area of the reticle substrate based on the correction module using the qualitative data.

16. The method of claim 1 wherein obtaining the qualitative data comprises using a measuring unit, the measuring unit comprises at least one of an interferometer, a scatterometer, an ultrasonic probe, or a topology tool, the method further comprising:
moving the measuring unit relative to the reticle to facilitate measurement of a physical characteristic in the patterned area and in the perimeter region; and
estimating the physical characteristics of the pattern area from the qualitative data.

17. A method of implementing a reticle in a photolithography tool, comprising:
obtaining data from within a pattern area of the reticle and from an unpatterned portion of a perimeter region of the reticle outside of the pattern area of the reticle and between alignment marks in the perimeter region, the data regarding topography, contour, and non-uniformities of the pattern area of the reticle through which an exposure radiation is to be directed for transferring a pattern from the reticle to a wafer, wherein the data is obtained remotely from the photolithography tool, and wherein the perimeter region is bounded by an edge of the reticle;
determining a correction model based at least in part on the data; and
applying the correction model to the photolithography tool to adjust for the topography, contour, and non-uniformities in the pattern area of the reticle.

18. The method of claim 17, further comprising fabricating the pattern to be transferred to the wafer in the pattern area before obtaining the data.

19. The method of claim 17, further comprising fabricating the pattern to be transferred to the wafer in the pattern area after obtaining the data.

20. The method of claim 17 wherein obtaining the data comprises measuring a parameter of the wafer at a plurality of locations in the pattern area.

21. The method of claim 17 wherein determining a correction model comprises determining an adjustment to at least one of an image optic of the photolithography tool and a wafer stage of the photolithography tool to compensate for the non-uniformities in the pattern area.

22. The method of claim 17, further comprising registering a measurement reference frame in which the data was obtained with a process reference frame of the photolithography tool in which the pattern is to be transferred to the wafer.

23. A method of implementing a reticle in a photolithography tool, comprising:
obtaining qualitative data from within a pattern area of the reticle and from an unmarked perimeter region of the reticle distinct from the pattern area of the reticle and between alignment marks in the perimeter region through which an exposure radiation is to be directed for transferring a pattern from the reticle to a wafer, wherein the unmarked region is bounded by the pattern area and an edge of the reticle;
determining a correction model to apply to the photolithography tool from the qualitative data; and
applying the correction model to the photolithography tool to adjust for unique physical characteristics in the pattern area of the reticle.

24. The method of claim 23 wherein the qualitative data is obtained remotely from the photolithography tool.

25. The method of claim 23, further comprising fabricating the pattern to be transferred to the wafer in the pattern area before obtaining the qualitative data.

26. The method of claim 23, further comprising fabricating the pattern to be transferred to the wafer in the pattern area after obtaining the qualitative data.

27. The method of claim 23, further comprising registering a measurement reference frame in which the qualitative data was obtained with a process reference frame of the photolithography tool in which a pattern is transferred to a wafer.

28. A method of implementing a reticle in a photolithography tool, comprising:
obtaining qualitative data from a pattern area and an unmarked portion of a perimeter region outside of the pattern area of the reticle and between alignment marks in the perimeter region at a location remote from the photolithography tool, the unmarked region being spaced apart from an alignment mark on the reticle, wherein the perimeter region is bounded by the pattern area and an edge of the reticle;
determining a correction model to apply to the photolithography tool from the qualitative data; and
applying the correction model to the photolithography tool to adjust for physical characteristics in the pattern area of the reticle.

29. The method of claim 28, further comprising obtaining the qualitative data from within a pattern area of the reticle through which an exposure radiation is to be directed for transferring a pattern from the reticle to a wafer.

30. The method of claim 28, further comprising fabricating a pattern to be transferred to a wafer in the pattern area before obtaining the qualitative data.

31. The method of claim 28, further comprising fabricating a pattern to be transferred to a wafer in the pattern area after obtaining the qualitative data.

32. The method of claim 28, further comprising registering a measurement reference frame in which the qualitative data was obtained with a process reference frame of the photolithography tool in which a pattern is to be transferred to a wafer.

33. A method of processing a micro-device wafer, comprising:
   obtaining qualitative data regarding topography, contour, and non-uniformities in a reticle from within a pattern area of the reticle and from a perimeter region surrounding the pattern area, a first area of the perimeter region being free from alignment marks and a second area of the perimeter region having alignment marks, wherein the pattern area is configured such that an exposure radiation from a photolithograph tool can pass through the pattern area, and wherein the perimeter region is bounded by the pattern area and an edge of the reticle;
   determining a correction model to apply to the photolithography tool from the qualitative data obtained from the pattern area;
   adjusting the photolithography tool to compensate for features of the reticle based on the correction model; and
   exposing the wafer to an exposure radiation to transfer a pattern in the pattern area of the reticle to the wafer in the photolithography tool.

* * * * *